United States Patent
Xu et al.

(10) Patent No.: US 12,469,747 B2
(45) Date of Patent: Nov. 11, 2025

(54) SELECTIVE METAL SELECTIVITY IMPROVEMENT WITH RF PULSING

(71) Applicant: Applied Materials, Inc., Santa Clara, CA (US)

(72) Inventors: Yi Xu, San Jose, CA (US); Yu Lei, Belmont, CA (US); Zhimin Qi, Fremont, CA (US); Aixi Zhang, Sunnyvale, CA (US); Xianyuan Zhao, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 452 days.

(21) Appl. No.: 18/149,829

(22) Filed: Jan. 4, 2023

(65) Prior Publication Data

US 2024/0222192 A1 Jul. 4, 2024

(51) Int. Cl.
*H01L 21/68* (2006.01)
*C23C 16/04* (2006.01)
*C23C 16/40* (2006.01)
*H01J 37/32* (2006.01)
(Continued)

(52) U.S. Cl.
CPC ...... *H01L 21/76877* (2013.01); *C23C 16/045* (2013.01); *C23C 16/405* (2013.01); *H01J 37/32146* (2013.01); *H01L 23/53238* (2013.01); *H01L 23/53266* (2013.01); *H01J 2237/3321* (2013.01); *H01J 2237/335* (2013.01)

(58) Field of Classification Search
CPC ......... H01L 21/76877; H01L 21/76814; H01L 21/76883; H01L 23/53238; H01L 23/53266; C23C 16/045; C23C 16/0245
See application file for complete search history.

(56) References Cited

U.S. PATENT DOCUMENTS

| 8,329,599 B2 | 12/2012 | Fukazawa et al. |
| 2004/0043598 A1* | 3/2004 | Park ............... H01L 21/76877 257/E21.585 |

(Continued)

FOREIGN PATENT DOCUMENTS

| CN | 106158960 A | 11/2016 |
| KR | 20100061566 A | 6/2010 |
| WO | 2020167611 A1 | 8/2020 |

OTHER PUBLICATIONS

PCT International Search Report and Written Opinion in PCT/US2024/010028 dated May 8, 2024, 11 pages.

*Primary Examiner* — Joseph A Miller, Jr.
(74) *Attorney, Agent, or Firm* — SERVILLA WHITNEY LLC

(57) ABSTRACT

Embodiments of the disclosure are directed to methods of removing metal oxide from a substrate surface by exposing the substrate surface to a hydrogen ($H_2$) plasma and pulses of RF. In some embodiments, the substrate surface has at least one feature thereon, the at least one feature defining a trench having a top surface, a bottom surface, and two opposed sidewalls. The hydrogen ($H_2$) plasma and pulses of RF remove substantially all of the metal oxide, e.g., tungsten oxide (WOx), molybdenum oxide (MoOx), or ruthenium oxide (RuOx), from the substrate surface, without damaging the dielectric and/or critical dimension (CD)/profile of the structure. A metal fill can then be selectively deposited in the trench.

15 Claims, 2 Drawing Sheets

(51) Int. Cl.
*H01L 21/768* (2006.01)
*H01L 23/532* (2006.01)

(56) References Cited

U.S. PATENT DOCUMENTS

| | | | |
|---|---|---|---|
| 2004/0127002 A1* | 7/2004 | Kim | H01L 21/76814 |
| | | | 257/E21.252 |
| 2005/0067099 A1 | 3/2005 | Walton et al. | |
| 2005/0085083 A1* | 4/2005 | Huang | H01L 21/0234 |
| | | | 257/E21.293 |
| 2007/0218623 A1 | 9/2007 | Chua et al. | |
| 2009/0029528 A1* | 1/2009 | Sanchez | H01L 21/67017 |
| | | | 257/E21.191 |
| 2013/0330920 A1 | 12/2013 | Liu et al. | |
| 2016/0141175 A1* | 5/2016 | Yan | H01L 21/0245 |
| | | | 134/1 |
| 2017/0175253 A1* | 6/2017 | Chistyakov | H01L 21/2855 |
| 2020/0105519 A1 | 4/2020 | Lin et al. | |
| 2021/0398850 A1 | 12/2021 | Xu et al. | |

* cited by examiner

SELECTIVE METAL SELECTIVITY IMPROVEMENT WITH RF PULSING

TECHNICAL FIELD

Embodiments of the present disclosure generally relate to an improved method of forming interconnects. In particular, embodiments of the disclosure are directed to methods adding RF pulsing in a plasma preclean to selectively deposit a metal.

BACKGROUND

Gapfill process are integral to several semiconductor manufacturing processes. A gapfill process can be used to fill a gap (or feature) with an insulating or conducting material. For example, shallow trench isolation, inter-metal dielectric layers, passivation layers, dummy gate, are all typically implemented by gapfill processes.

As device geometries continue to shrink (e.g., critical dimensions <20 nm, <10 nm, and beyond) and thermal budgets are reduced, defect-free filling of spaces becomes increasingly difficult due to the limitations of conventional deposition processes.

Incoming substrates often have residue on them from previous processing, from native oxide formation on a metal, and etch residue from via/trench hole formation. Native oxide, such as tungsten oxide (WOx), forms as a result of etching a via/trench and vacuum break. To improve process performance of a metal fill, e.g., low line resistance, high yield, and high reliability, any residue and/or native oxide must be removed. Thus, a pre-clean process is required to clean the native oxide, such as tungsten oxide (WOx) to minimize resistive capacitance ("resistivity" or "resistance") in the integrated circuit.

Current pre-clean processes involve exposing the substrate to a plasma of argon (Ar) and hydrogen ($H_2$) to remove the native oxide. These preclean processes are performed in the presence of an external bias at the substrate surface, which may damage the dielectric and critical dimension (CD)/profile of the structure and lead to lower selectivity during subsequent metal deposition. Specifically, the high energy component in the $H_2$ plasma causes damage on dielectrics, leaving defects. The defects become the nucleation sites for W growth, resulting in the growth on the unpreferred dielectric surface and a resulting selectivity loss.

Therefore, there is a need in the art for improved processes for cleaning materials and structures on semiconductor substrates without damaging the dielectric and decreasing selectivity.

SUMMARY

One or more embodiments are directed to a method of forming semiconductor device. The method comprises: exposing a substrate surface to a hydrogen ($H_2$) plasma and RF pulses to pre-clean the substrate surface, forming a clean surface; and depositing a metal fill on the clean surface.

Additional embodiments are directed to a processing method for forming a semiconductor device. In one or more embodiments, the processing method comprises: pre-cleaning a substrate by exposing the substrate to a hydrogen ($H_2$) plasma and RF pulses to form a cleaned substrate, the substrate having at least one feature formed therein, the at least one feature comprising sidewalls of a first dielectric layer and a second dielectric layer, and a bottom surface comprising a metal layer having a metal oxide layer formed on a top surface of the metal layer; and depositing a metal fill on the cleaned substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
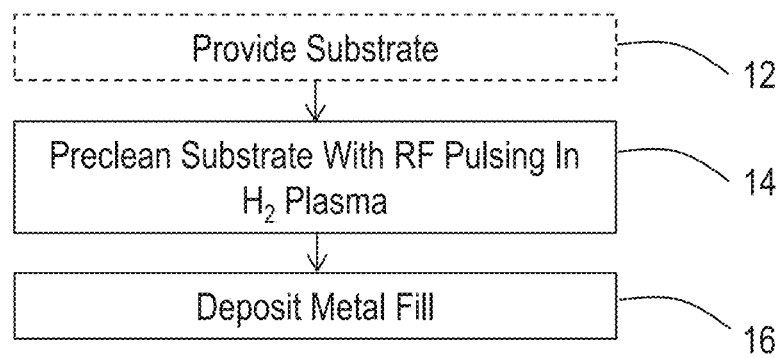
FIG. 1 illustrates a process flow diagram of a method according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used herein, the term "substrate surface" refers to any substrate surface upon which a layer may be formed. The substrate surface may have one or more features formed therein, or thereon, one or more layers formed thereon, and combinations thereof. The shape of the feature can be any suitable shape including, but not limited to, peaks, trenches, and cylindrical vias. As used in this regard, the term "feature" refers to any intentional surface irregularity. Suitable examples of features include but are not limited to trenches which have a top surface, two opposed sidewalls and a bottom surface, peaks which have a top and two sidewalls extending upward from a surface, and vias which have sidewalls extending down from a surface with a bottom. In some embodiments, the bottom of a via comprises an open bottom defined or bounded by underlying material, for example, dielectric material, which may also define the two sidewalls, or the underlying material at the bottom may be a conductor such as a metal (e.g., copper), which can be the same as or different from the sidewall material.

The term "on" indicates that there is direct contact between elements. The term "directly on" indicates that there is direct contact between elements with no intervening elements.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In one or more embodiments, a film is conformally deposited on a surface. As used herein, the term "conformal", or "conformally", refers to a film that adheres to and uniformly covers exposed surfaces with a thickness having a variation of less than 5%, less than 2%, or less than 1% relative to the average thickness of the film. For example, a 1,000 Å thick film may have less than a 10 Å variation in thickness. This thickness and variation include at least edges, corners, sides, and the bottom of recesses. For example, a conformal film deposited by ALD in various embodiments of the disclosure would provide coverage over the deposited region of essentially uniform thickness on complex surfaces.

Embodiments of the disclosure advantageously provide methods of removing a metal oxide from a substrate surface with RF plasma pulsing. Advantageously, the disclosure provides processes for pre-cleaning materials and structures on semiconductor substrates without damaging the dielectric and/or critical dimension (CD)/profile of the structure.

Current pre-clean processes involve exposing the substrate to a plasma of argon (Ar) and hydrogen ($H_2$) to remove the native oxide. These preclean processes are performed in the presence of an external bias at the substrate surface, which may damage the dielectric and critical dimension (CD)/profile of the structure and lead to lower selectivity during subsequent metal deposition. Specifically, the high energy component in the $H_2$ plasma causes damage on dielectrics, leaving defects. The defects become the nucleation sites for W growth, resulting in the growth on the unpreferred dielectric surface and a resulting selectivity loss In one or more embodiments, it has been surprisingly found that adding RF pulsing during $H_2$ plasma pre-clean removes the metal oxide from the substrate surface without damaging the dielectric surface. Advantageously, RF pulsing can change the plasma ion energy distribution, reducing the high energy ion density, thus resulting in less damage to the dielectric surface. In one or more embodiments, RF pulsing increases the ratio of low energy ions and radicals. Low energy ions and radicals can remove surface contaminants and reduce metal oxides, e.g., WOx. Additionally, low energy ions and radicals effectively reduce the dielectric damage during the pre-clean process, but still maintain effective cleaning.

Further embodiments of the disclosure are described by way of the Figures, which illustrate substrate surfaces, a feature formed on a substrate surface, and processes for removing a metal oxide from the substrate surface and the surfaces of the feature in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a process flow diagram of a method 10 according to one or more embodiments. In one or more embodiments, the method 10, at operation 12, begins by providing a substrate. As used in this specification and the appended claims, the term "provided" means that the substrate is made available for processing (e.g., positioned in a processing chamber). At operation 14, the substrate surface is pre-cleaned with RF pulsing in hydrogen ($H_2$) plasma. At operation 16, a metal is selectively deposited on the cleaned surface.

Figure 2:
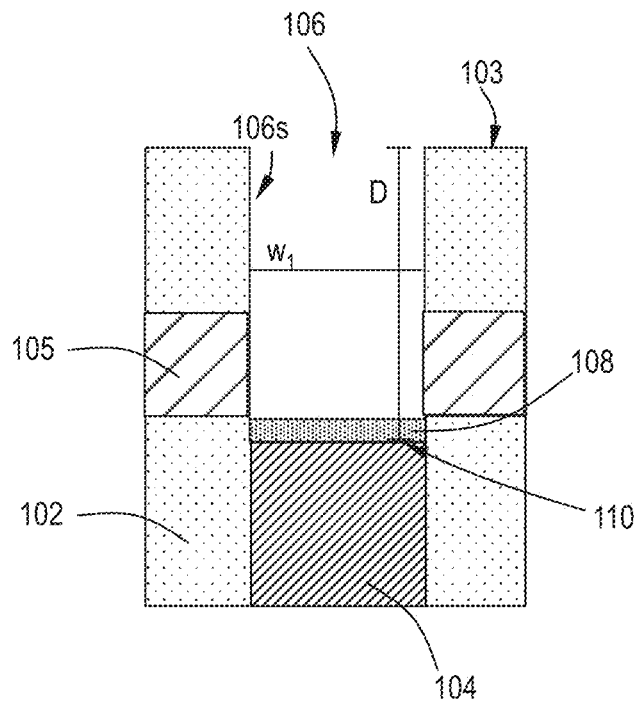
FIG. 2 illustrates a schematic cross-sectional view of a feature on a substrate according to one or more embodiments of the disclosure.
Figure 3:
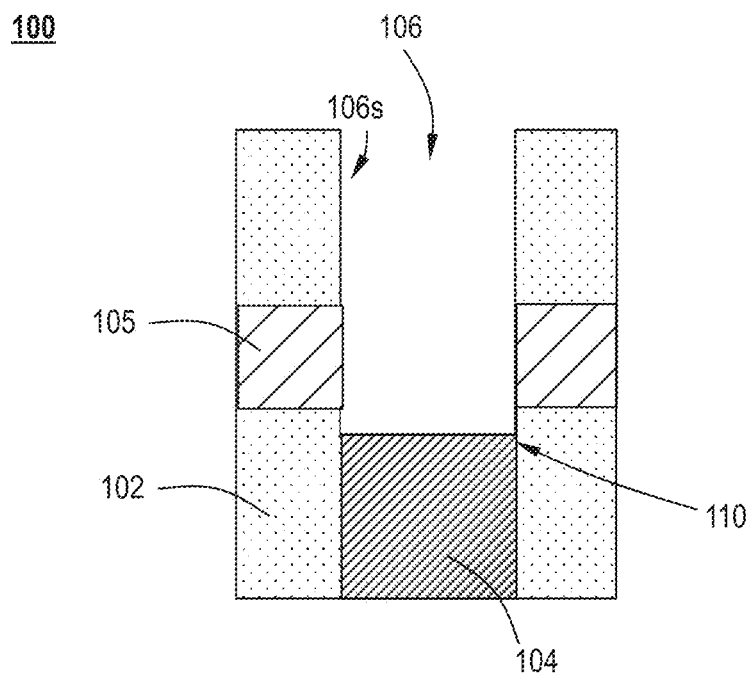
FIG. 3 illustrates a schematic cross-sectional view of a feature on a substrate according to one or more embodiments of the disclosure.
Figure 4:
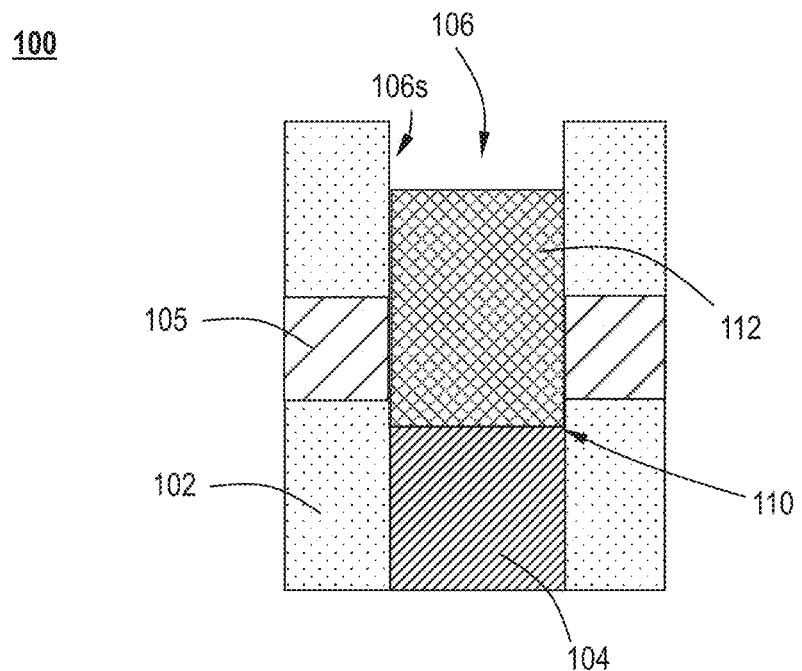
FIG. 4 illustrates a schematic cross-sectional view of a feature on a substrate according to one or more embodiments of the disclosure.

FIGS. 2-4 are schematic cross-section views of an exemplary device during the processing method 10 according to one or more embodiments of the disclosure. With reference to FIG. 2, a substrate 100 is provided for processing at operation 12. In some embodiments, the substrate 100 is a wafer, for example a semiconductor substrate. In one or more embodiments, the substrate 100 includes a first dielectric layer 102 and a second dielectric layer 105. In one or more embodiments, the substrate 100 has at least one feature 106 formed therein.

In one or more embodiments, one or more of the first dielectric layer 102 and the second dielectric layer 105 is deposited using any suitable deposition technique, such as, but not limited to, chemical vapor deposition ("CVD"), physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

As used herein, the term "dielectric" refers to a layer of material that is an electrical insulator that can be polarized in an electric field. In one or more embodiments, one or more of the first dielectric layer 102 and the second dielectric layer 105 independently comprises one or more of oxides, carbon doped oxides, silicon oxide (SiOx), silicon nitride (SiN), silicon oxide/silicon nitride, carbides, oxycarbides, nitrides, oxynitrides, oxycarbonitrides, polymers, phosphosilicate glass, fluorosilicate (SiOF) glass, organosilicate glass (SiOCH), silicon carbo nitride (SiCN). In one or more embodiments, one or more of the first dielectric layer 102 and the second dielectric layer 105 include, without limitation, furnace, CVD, PVD, ALD and spin-on-coat (SoC) deposited films. In one or more embodiments, one or more of the first dielectric layer 102 and the second dielectric layer 105 may be exposed to in-situ or ex-situ pretreatment and post-treatment process to dope, infuse, implant, heat, freeze, polish, etch, reduce, oxidize, hydroxylate, anneal, UV cure, e-beam cure and/or bake the surface or bulk of the dielectric. In one or more specific embodiments, one or more of the first dielectric layer 102 comprises silicon oxide (SiOx) and the second dielectric layer 105 comprises silicon nitride (SiN). The silicon nitride (SiN) may be doped or undoped.

As used in this specification and the appended claims, the term "oxide" or the like means that the material contains the specified element(s). The term should not be interpreted to imply a specific ratio of elements. Accordingly, an "oxide" or the like may comprise a stoichiometric ratio of elements or a non-stoichiometric ratio of elements.

For illustrative purposes, FIGS. 2-4 show the substrate 100 having a single feature 106. One skilled in the art will recognize, however, that there can be more than one feature and that a plurality of features will each be affected by the disclosed methods in a similar manner.

As used herein, the term "feature" refers to an intentional surface irregularity. The shape of the feature 106 can be any suitable shape including, but not limited to, trenches, vias that, when filled with metal, transfer current between layers, and lines that transfer current within the same device layer. In some embodiments, the feature 106 defines a gap in the dielectric layer (silicon nitride layer) 105. As used herein, the term "feature" refers to any intentional surface irregularity. Suitable examples of features include, but are not limited to, trenches which have a top, two sidewalls, and a bottom, peaks which have a top and two sidewalls. Features can have any suitable aspect ratio (ratio of the depth of the feature to the width of the feature). In some embodiments, the aspect ratio is greater than or equal to about 1:1, 2:1, 3:1, 4:1, 5:1, 10:1, 15:1, 20:1, 25:1, 30:1, 35:1 or 40:1.

Features can have any suitable critical dimension (CD). As used herein, the term "critical dimension (CD)" refers to the width of the feature or opening. In one or more embodiments, the critical dimension width, w1, of the feature 106, is in a range of from 50 Å to 500 Å, or is in a range of from 50 Å to 500 Å.

In one or more embodiments, the at least one feature 106 has a width $w_1$. The feature 106 is formed in a top surface 103 of the substrate 100. The feature 106 also has one or more sidewall 106s and extends a feature depth D from the top surface 103 to a bottom 110 which is the top surface of a metal 104. While straight, vertical sidewalls 106s are shown in the Figures, the disclosed methods may also be performed on slanted, irregular, or reentrant sidewalls.

In some embodiments, the opening width W of the opening 212 is less than or equal to about 50 nm, less than or equal to about 30 nm, less than or equal to about 20 nm, less than or equal to about 10 nm, or less than or equal to about 7 nm. In some embodiments, the opening width $w_1$ is in a range of about 8 nm to about 20 nm.

In some embodiments, the feature depth D of the feature 106 is greater than or equal to about 20 nm, greater than or equal to about 50 nm, greater than or equal to about 60 nm, greater than or equal to about 75 nm, greater than or equal to about 100 nm, greater than or equal to about 150 nm, or up to about 200 nm. In some embodiments, the opening width $w_1$ is in a range of about 60 nm to about 100 nm.

In one or more embodiments, the bottom 110 of the feature 106 comprises a top surface of a metal 104. The metal 104 may comprise any suitable metal known to the skilled artisan. In one or more embodiments, the metal 104 comprises one or more of tungsten (W), molybdenum (Mo), ruthenium (Ru), copper (Cu), cobalt (Co), or tantalum (Ta).

With reference to FIG. 2, in one or more embodiments, the substrate 100 often has native oxide formed on it during the formation of the metal layer 104 and exposure to air. Thus, in one or more embodiments, a metal oxide layer 108 is formed on a top surface of the metal layer 104. Native oxide, such as tungsten oxide (WOx), forms as a result of etching a via/trench and vacuum break. In one or more embodiments, the metal oxide layer 108 comprises an oxide of the underlying metal layer. Thus, in one or more embodiments, the metal oxide layer 108 comprises one or more of tungsten oxide (WOx), molybdenum oxide (MoOx), ruthenium oxide (RuOx), copper oxide (CuOx), cobalt oxide (CoOx), or tantalum oxide (TaOx).

With reference to FIG. 1 and FIG. 3, at operation 14, the substrate 100 is pre-cleaned by exposure to a plasma with RF pulsing. Pre-cleaning results in removal of the metal oxide layer 108, leaving a clean surface at the bottom of the feature 106.

In one or more embodiments, the plasma comprises one or more of hydrogen ($H_2$) and argon (Ar). In specific embodiments, the plasma comprises a hydrogen ($H_2$) plasma.

In one or more unillustrated embodiments, the plasma system comprises an inlet to input one or more process gases through a mass flow controller to a plasma source. A plasma source comprising a showerhead is coupled to the processing chamber to receive one or more process gases to generate plasma. The plasma source is coupled to a RF source power. The plasma source through the showerhead generates a hydrogen ($H_2$) plasma in the processing chamber using a high frequency electric field. A plasma bias power is coupled to the pedestal via the RF match to energize the plasma.

In one or more embodiments, it was found that exposing the substrate 100 to a hydrogen plasma with continuous RF pulsing resulted in a high ion energy, leading to damage to one or more of the first dielectric layer 102 and the second dielectric layer 105 and decreased selectivity during subsequent metal fill deposition.

Accordingly, in one or more embodiments a RF pulses are introduced, and the ion energy was lowered. In one or more embodiments, the pulse frequency was in a range of from 100 Hz to 10 kHz. In one or more embodiments, the RF pulse was on with a duty cycle in a range of from greater than 0% to less than 50%, or in a range of from 15% to 50%.

In one or more embodiments, exposing the substrate 100 to the RF pulsing with hydrogen plasma advantageously removes substantially all of the metal oxide layer 108 from the substrate surface. As used in this regard, "substantially all of the metal oxide" means that less than about 5%, including less than about 4%, less than about 3%, less than about 2%, less than about 1%, less than about 0.5%, and less than about 0.1% of the total composition of the metal oxide on the substrate surface remains after exposing the substrate surface to the RF pulsing with hydrogen plasma.

Referring to FIG. 1 and FIG. 4, in one or more embodiments, at operation 16, a metal fill 112 is deposited on the clean metal surface 110 and on the first dielectric layer 102 and on the second dielectric layer 105. The metal fill 112 may include any suitable metal known to the skilled artisan. In some embodiments, the metal fill 112 comprises a transition metal. In some embodiments, the metal fill 112 comprises one or more of tungsten (W), molybdenum (Mo), ruthenium (Ru), copper (Cu), cobalt (Co), tantalum (Ta), or alloys thereof. In some embodiments, depositing the metal fill 112 on the clean metal surface comprises one or more of atomic layer deposition (ALD), and chemical vapor deposition (CVD). In some embodiments, the substrate surface is exposed to a first precursor and a second precursor simultaneously. In some embodiments, the substrate surface is exposed to the first precursor and the second precursor sequentially.

In some embodiments, depositing the metal fill 112 comprises atomic layer deposition (ALD), which includes one or more cycles of exposing the substrate surface to a first precursor, a purge gas, a second precursor, and the purge gas.

In some embodiments, depositing the metal fill 112 comprises a spatial ALD process, wherein a first reactive gas and second reactive gas are delivered simultaneously to the reaction zone but are separated by an inert gas curtain and/or a vacuum curtain. In some embodiments, depositing the metal film comprises co-flowing the first reactive gas and the second reactive gas. In some embodiments, depositing the metal film comprises chemical vapor deposition (CVD).

Further aspects of the disclosure pertain to a method that is part of a gap fill process. In some embodiments, the metal fill 112 is deposited on one or more high aspect ratio gap features, including vertical gap features and/or horizontal gap features, and the metal fill 112 in the gap features 106 forms horizontal interconnects through which current flows. Without intending to be bound by theory, gaps, such as feature 106, filled with the metal fill 112 conformally deposited on the clean metal surface 110 that has been exposed to the RF pulsing with hydrogen plasma, according to one or more embodiments of the methods described herein, result in improved electrical operation of an integrated circuit, by minimizing power losses and overheating in the integrated circuit.

Referring to FIG. 4, the metal fill 112 may be conformally deposited on the clean metal surface 110 to fill the feature 106. In some embodiments, the metal fill 112 is conformally deposited on the clean metal surface 110 by one or more of atomic layer deposition (ALD), chemical vapor deposition (CVD), or pulsed CVD (pCVD) to a desired thickness fill the feature 106.

The gap filling process may comprise any suitable gap filling process known to the skilled artisan. In one or more embodiments, the gap filling process comprises exposing the semiconductor structure 100 to a metal precursor and a reactant. In some embodiments, the metal precursor comprises one or more of a molybdenum precursor, a tungsten precursor, a cobalt precursor, and a ruthenium precursor.

In some embodiments, the gap filling process is a bottom-up gap filling process. In other embodiments, the gap filling process comprises a conformal gap filling process.

In some embodiments, the metal fill 112 is laterally bounded by the two opposed sidewalls 106s of the trench 106. As used in this regard, "laterally bounded" means that the deposited material does not extend beyond the point of intersection between the top surface and the two opposed sidewalls 106s. In some embodiments, the metal fill 112 extends above the trench 106. In some embodiments, the metal fill 112 fills the trench 106. As used in this regard, a film which "fills the trench" has a volume which occupies at least 95%, at least 98%, or at least 99% of the volume of the trench 106. In some embodiments, the metal fill 112 which fills the trench 106 has a fill height in a range of from 30 nm to 75 nm, including in a range of from 40 nm to 60 nm.

Embodiments of the disclosure advantageously provide metal films (e.g., the metal fill 112) that are free or substantially free of voids and seams. As used in this regard, "substantially free" means that less than about 5%, including less than about 4%, less than about 3%, less than about 2%, less than about 1%, less than about 0.5%, and less than about 0.1% of the total composition of the conformally deposited metal film (e.g., the metal fill 112), on an atomic basis, comprises voids and/or seams.

The methods described herein may be performed in any suitable processing chamber known to the skilled artisan. The processing chamber may be any suitable Preclean chamber. The methods described herein may be performed in, for example, an atomic layer deposition (ALD) processing chamber (including a spatial ALD processing chamber), a chemical vapor deposition (CVD) processing chamber, or a pulsed CVD (pCVD) processing chamber.

In some embodiments, the operations of the methods described herein are each performed within the same processing chamber or within the same processing system. In some embodiments, the operations of the methods described herein are each performed within a different processing chamber. In some embodiments, the different processing chambers are connected as part of a processing system. In some embodiments, the operations of the methods described herein are each performed within a different processing chamber, and each different processing chamber is part of a separate processing system. In some embodiments, the operations of the methods described herein are performed without an intervening vacuum break.

In some embodiments, one or more of the operations of the methods described herein is performed in situ without breaking vacuum. In some embodiments, one or more of the operations of the methods described herein is performed ex situ. As used herein, the term "in situ" refers to operations of the methods described herein that are each performed in the same processing chamber or a different processing chamber that is connected as part of a processing system, such that each of the operations of the methods described herein are performed without an intervening vacuum break. As used herein, the term "ex situ" refers to operations of the methods described herein that are each performed in the same processing chamber or a different processing chamber such that one or more of the operations of the methods described herein are performed with an intervening vacuum break.

One or more embodiments of the disclosure are directed to a non-transitory computer readable medium including instructions, that, when executed by a controller of a processing chamber, cause the processing chamber to perform the methods described herein, e.g., methods 100 and 200. In some embodiments, the non-transitory computer readable medium includes instructions, that, when executed by a controller of a processing chamber, cause the processing chamber to expose the substrate surface to hydrogen ($H_2$) plasma with a pulsed RF to remove the metal oxide to form a clean metal surface. In some embodiments, the non-transitory computer readable medium includes instructions, that, when executed by a controller of a processing chamber, cause the processing chamber to deposit a metal fill on the clean metal surface.

Reference throughout this specification to "one embodiment," "certain embodiments," "one or more embodiments" or "an embodiment" means that a particular feature, structure, material, or characteristic described in connection with the embodiment is included in at least the embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming semiconductor device, the method comprising:
    exposing a substrate surface to a plasma consisting essentially of hydrogen (H2) and to RF pulses, the substrate surface comprising at least one feature having a bottom surface and at least one sidewall surface, the bottom surface comprising a metal layer with a metal oxide layer formed thereon and the at least one sidewall surface comprising a first dielectric layer and a second dielectric layer, to pre-clean the metal layer and remove the metal oxide layer to form a clean metal surface, wherein after being exposed to the plasma the first dielectric layer and the second dielectric layer are free of defects; and
    depositing a metal fill on the clean metal surface.

2. The method of claim 1, arm wherein the first dielectric layer comprises silicon oxide (SiOx) and the second dielectric layer comprises silicon nitride (SiN).

3. The method of claim 1, wherein the plasma and the RF pulses remove substantially all of the metal oxide layer from the metal layer.

4. The method of claim 1, wherein the metal layer comprises one or more of tungsten (W), molybdenum (Mo), ruthenium (Ru), copper (Cu), cobalt (Co), and tantalum (Ta).

5. The method of claim 1, wherein the metal oxide layer comprises one or more of tungsten oxide (WOx), molybdenum oxide (MoOx), ruthenium oxide (RuOx), copper oxide (CuOx), cobalt oxide (CoOx), and tantalum oxide (TaOx).

6. The method of claim 1, wherein the metal fill comprises one or more of tungsten (W), molybdenum (Mo), ruthenium (Ru), copper (Cu), cobalt (Co), and tantalum (Ta).

7. The method of claim 1, wherein the RF pulses have a pulse frequency in a range of from 100 Hz to 10 kHz.

8. The method of claim 7, wherein the RF pulses have a duty cycle in a range of from 15% to 50%.

9. A processing method for forming a semiconductor device, the method comprising:
    pre-cleaning a substrate by exposing the substrate to a plasma consisting essentially of hydrogen ($H_2$) and to RF pulses to form a cleaned substrate, the substrate having at least one feature formed therein, the at least one feature comprising sidewalls of a first dielectric layer and a second dielectric layer, and a bottom surface comprising a metal layer having a metal oxide layer formed on a top surface of the metal layer, wherein the RF pulses have a pulse frequency in a range of from 100 Hz to 10 kHz and a duty cycle in a range of from 15% to 50%, wherein after being exposed to the plasma the first dielectric layer and the second dielectric layer are free of defects;
    and depositing a metal fill on the cleaned substrate.

10. The method of claim 9, wherein the first dielectric layer comprises silicon oxide (SiOx) and the second dielectric layer comprises silicon nitride (SiN).

11. The method of claim 9, wherein the plasma and the RF pulses remove substantially all of the metal oxide layer from the metal layer.

12. The method of claim 9, wherein the metal layer comprises one or more of tungsten (W), molybdenum (Mo), ruthenium (Ru), copper (Cu), cobalt (Co), and tantalum (Ta).

13. The method of claim 9, wherein the metal oxide layer comprises one or more of tungsten oxide (WOx), molybdenum oxide (MoOx), ruthenium oxide (RuOx), copper oxide (CuOx), cobalt oxide (CoOx), and tantalum oxide (TaOx).

14. The method of claim 9, wherein the metal fill comprises one or more of tungsten (W), molybdenum (Mo), ruthenium (Ru), copper (Cu), cobalt (Co), and tantalum (Ta).

15. The method of claim 9, wherein the metal fill is deposited in a bottom-up gap fill process.

* * * * *